United States Patent [19]
Ono

[11] Patent Number: 6,160,338
[45] Date of Patent: Dec. 12, 2000

[54] TRANSPORT APPARATUS

[75] Inventor: Kazuya Ono, Yokohama, Japan

[73] Assignee: Nikon Corporation, Tokyo, Japan

[21] Appl. No.: 09/515,868

[22] Filed: Feb. 29, 2000

Related U.S. Application Data

[63] Continuation of application No. 08/872,338, Jun. 10, 1997, abandoned.

[30] Foreign Application Priority Data

Jun. 11, 1996 [JP] Japan .................................. 8-171789

[51] Int. Cl.⁷ .............................. B65G 49/07; H01L 21/00
[52] U.S. Cl. .......................... 310/309; 414/935; 414/936; 310/12
[58] Field of Search ................................ 310/12; 29/785; 414/935, 936; 198/381, 619

[56] References Cited

U.S. PATENT DOCUMENTS

| | | | |
|---|---|---|---|
| 4,654,571 | 3/1987 | Hinds | 318/687 |
| 4,848,536 | 7/1989 | Machida | 198/619 |
| 5,196,745 | 3/1993 | Trumper | 310/12 |
| 5,789,843 | 8/1998 | Higuchi et al. | 310/309 |
| 5,796,467 | 8/1998 | Suzuki | 355/53 |

FOREIGN PATENT DOCUMENTS 6-14520  1/1994  Japan .
8-168271  6/1996  Japan .

OTHER PUBLICATIONS

Ford, Roger, et al., Noncontact Semiconductor Wafer Handling, Technical Paper, MS90–478, Society of Manufacturing Engineers, 1990, pp. 1–10. (Month Unknown).

*Primary Examiner*—Nestor Ramirez
*Assistant Examiner*—Judson H. Jones
*Attorney, Agent, or Firm*—Morgan, Lewis & Bockius LLP

[57] ABSTRACT

A transport apparatus for holding and transporting a conductive, planar object without contact is provided. The transport apparatus includes pairs of floating-use electrodes to which a certain potential difference is applied to produce electrostatic attraction force for attracting and floating the object in a non-contact state, pairs of driving-use electrodes to which suitable potential differences are applied to cause currents to flow in portions of the object that face these electrodes, and magnetic devices for generating magnetic fields that interact with the currents to produce drive forces or Lorentz forces acting on the object. The transport apparatus further includes displacement sensors for measuring the position of the object in a two-dimensional plane parallel to the carrying surface of the apparatus, and a control device that controls the potential differences applied to the driving-use electrode pairs and the intensity of the magnetic fields, based on measurement results of the displacement meters.

47 Claims, 8 Drawing Sheets

TRANSPORT APPARATUS

This application is a continuation of U.S. application Ser. No. 08/872,338 filed Jun. 10, 1997 abandoned. This application claims the benefit of Japanese Application No. 08-171789, filed on Jun. 11, 1996, which is hereby incorporated by reference.

BACKGROUND OF THE INVENTION

1. Field of the Invention

The present invention generally relates to a transport apparatus, and in particular to a transport apparatus for transporting a planar, conductive object without contacting the object.

2. Discussion of the Related Art

In the photolithography step of manufacturing semiconductor devices, for example, an exposure apparatus is used. This apparatus has been used for transferring through a projection optical system a circuit pattern formed on a mask (which will be generally called "reticle") onto a photosensitive substrate, such as a wafer, whose surface is coated with photoresist. The wafers to be exposed are successively transported by a transport apparatus to a predetermined position on an exposure stage of the exposure apparatus.

An example of the transport apparatus is a vacuum hand that applies a vacuum suction to a wafer. This vacuum suction holds and transports the wafer. FIG. 8 is a plan view showing a conventional vacuum hand for transporting a wafer. FIG. 9 is a front view of the conventional vacuum hand of FIG. 8. The vacuum hand 102 is provided with a vacuum groove 104 formed in an upper surface of a distal end portion thereof to suck the wafer by a vacuum force generated by a vacuum pump (not shown) and applied through the vacuum groove 104. To transport the wafer W, therefore, the distal end portion of the vacuum hand 102 having the vacuum groove 104 is brought into contact with the rear surface of the wafer W, and a vacuum force is applied to the wafer W through the groove 104 to capture the wafer W on the vacuum hand 102. In this condition, the vacuum hand 102 is moved to an unloading position on the exposure stage, and then the suction is stopped so that the wafer W is released from the vacuum hand 102. In this manner, the wafer W is transported to a predetermined position on a wafer stage. Thus, the vacuum hand 102 transports the wafer W while contacting the rear surface of the wafer W.

Another example of the transport apparatus is an electrostatic floating type, which utilizes electrostatic force generated by electrodes. The electrostatic floating type apparatus captures the wafer in the air by balancing the attraction force with the self-weight of the wafer (FIG. 10). In this electrostatic floating type transport apparatus, a large number of electrode portions 108 are arranged in a bottom surface of a main body 106 of the apparatus at a regular interval, for example, and an electrostatic potential (voltage) having a predetermined polarity is applied to each of the electrode portions 108.

In transporting the wafer W using this electrostatic floating type transport apparatus, positive (+) potentials are applied to the electrode portions 108 located right above the wafer W (five electrode portions in FIG. 10) and negative (−) charges are induced on the surface of the wafer W facing the electrode portions 108 with a clearance (corresponding to dielectric) due to electrostatic induction of the wafer W (conductive body) doped with ions. Therefore, the wafer W is attracted toward the main body 106 (in the direction of arrow "C" in FIG. 10) due to the electrostatic force acting between different kinds of charges. The potential applied to each of the electrode portions 108 is controlled so as to balance the self-weight of the wafer W with the generated electrostatic force (attraction force). Thus, the wafer W is kept floating in the air, maintaining a predetermined distance from the main body 106, as shown in FIG. 10. If the main body 106 of the transport apparatus is moved in this situation, the wafer W is transported without contacting the main body 106.

To control the position of the floating wafer W with respect to the main body 106, a positive (+) potential is applied to an electrode portion 108a located at the right end of the wafer W of FIG. 10, and a negative (−) potential is applied to an electrode portion 108b located at the left end of the wafer W, for example. With negative (−) charges induced in the surface of the wafer W, the electrode portion 108b and the wafer W repulses from each other, and the electrode portion 108a and the wafer W are attracted to each other, thereby moving the wafer W to the right (in the direction of arrow "D" in FIG. 10). Thus, in the electrostatic floating type apparatus, the horizontal position of the wafer W in the two-dimensional plane relative to the main body 106 can be finely adjusted by controlling the potentials of the electrode portions 108 located at the end portions of the wafer.

When the above-described vacuum hand 102 is used to transport the wafer W, dust or other foreign objects tend to stick to the wafer W due to contact between the vacuum band 102 and the rear surface of the wafer W; this dust or the like degrades the yield in manufacture of semiconductor devices.

In the electrostatic floating type transport apparatus in which electric potentials are applied to the electrode portions 108 to produce electrostatic force for attracting the wafer W while keeping it floating, on the other hand, dust or the like is unlikely to stick to the wafer since the wafer and the transport apparatus do not contact each other; the problem of poor yield is therefore prevented. However, since the wafer W is held in the air without contacting the transport apparatus and almost no friction is present between the wafer W and the transport apparatus, it is difficult to stop rotation of the wafer W. It also is difficult to control the rotational angle $\theta$ of the wafer W if rotational momentum about the Z-axis arises due to some disturbance applied to the wafer W during the movement of the main body 106 or during the position control of the wafer W relative to the main body 106, for example. Therefore, the wafer W can not be placed in a predetermined (or design) position on the wafer stage with high accuracy.

SUMMARY OF THE INVENTION

Accordingly, the present invention is directed to a transport apparatus that substantially obviates the problems due to limitations and disadvantages of the related art.

An object of the present invention is to provide a non-contact type transport apparatus that is able to accurately transport an object to a desired position without causing the object to move relative to the apparatus.

Another object of the present invention is to provide a non-contact type transport apparatus that is able to accurately transport an object to a desired position through controlling the position of the object relative to the apparatus.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention provides a transport apparatus for holding and transporting a conductive, planar object without contacting the object, including at least one pair of first electrodes located above an upper surface of the object, each of the at least one pair of first electrodes having two electrodes opposite each other and carrying a potential difference therebetween to induce charges of opposite polarity on the upper surface of the object that faces the pair of first electrodes; at least three pairs of second electrodes located above the upper surface of the object, each of the three pairs of second electrodes having two electrodes opposite each other and carrying a potential difference therebetween to induce a current in the upper surface of the object that faces the pair of second electrodes; a magnetic field generator for generating magnetic fields in directions perpendicular to the directions of the currents induced in the object by the at least three pairs of second electrodes; at least three horizontal displacement sensors for measuring the position of the object in a two-dimensional plane substantially parallel to the upper surface of the object; and a controller controlling the potential difference applied to each of the at least three pairs of second electrodes and the intensities of the magnetic fields generated by the magnetic field generator in accordance with the position of the object measured by the horizontal displacement sensors.

In another aspect, the present invention provides a transport apparatus for holding and transporting a conductive, planar object without contacting the object, including at least three pairs of electrodes located above an upper surface of the object, each of the at least three pairs of electrodes having two electrodes opposite each other and carrying a potential difference therebetween to induce charges of opposite polarity and a current at the upper surface of the object that faces the pair of electrodes; a magnetic field generator for generating magnetic fields in directions perpendicular to the directions of the currents induced in the object by the pairs of electrodes; at least three horizontal displacement sensors for measuring the position of the object in a two-dimensional plane substantially parallel to the upper surface of the object; and a controller for controlling the potential difference applied to each of the at least three pairs of electrodes and intensities of the magnetic fields generated by the magnetic field generator in accordance with the position of the object measured by the horizontal displacement sensors.

In a further aspect, the present invention provides a rotational motion generator for use in a non-contact transport apparatus for holding and transporting a planar, conductive object without contact, including a support; a plurality of driving-use electrode pairs disposed on the support, each of the driving-use electrode pairs carrying a time-varying potential difference therebetween to induce an electric current in the object, at least two of the driving-use electrode pairs inducing the electric currents in different directions; and a plurality of magnetic field generators, each disposed adjacent a corresponding driving-use electrode pair, each of the magnetic field generators generating a time-varying magnetic field intersecting the current induced by the corresponding driving-use electrode pair, thus generating a Lorentz force in the object, the magnetic field being substantially perpendicular to the surface of the object such that the Lorentz force is generated in a direction substantially parallel to the surface of the object.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Figure 1:
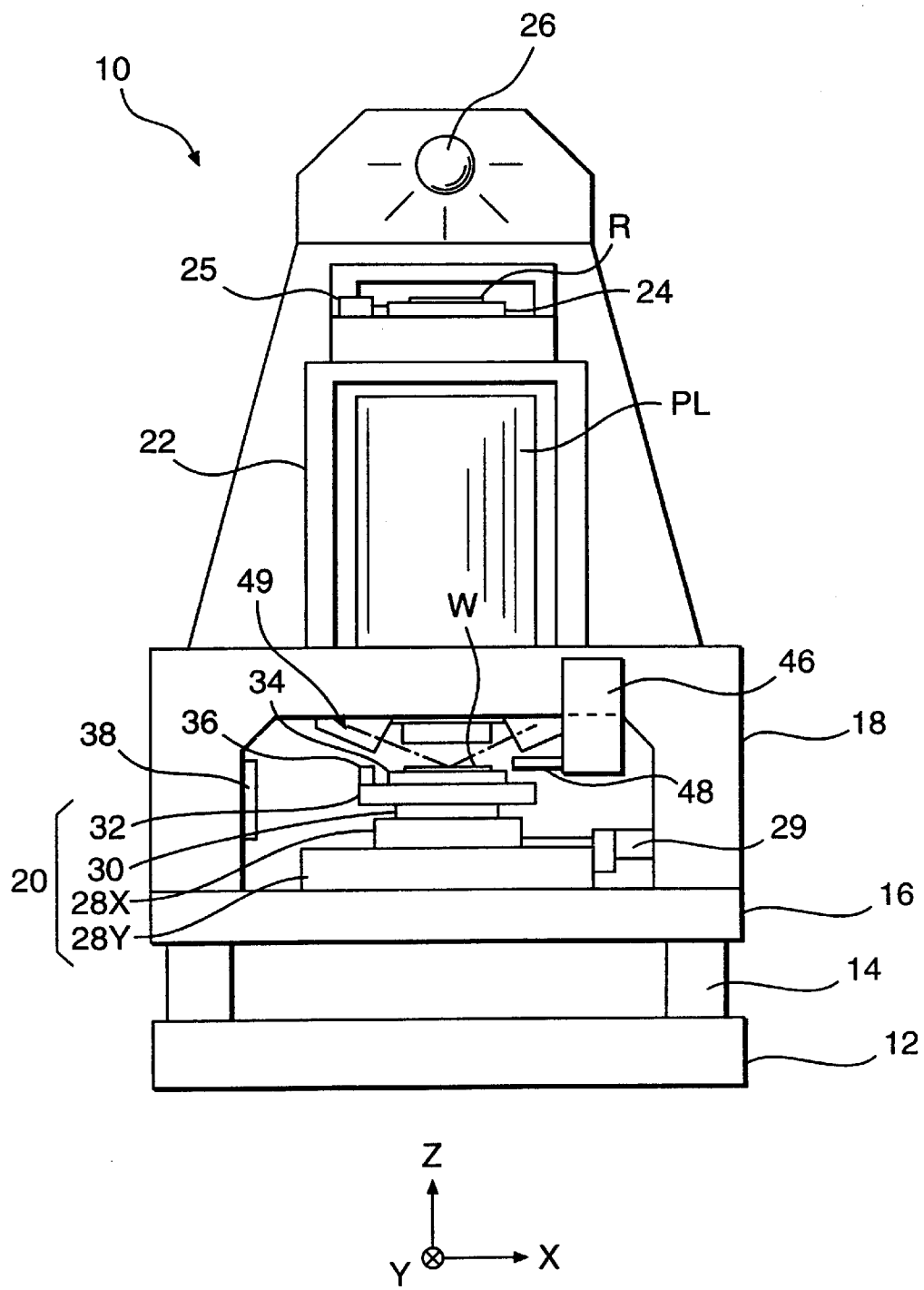
FIG. 1 is a front view schematically showing the entire construction of an exposure apparatus according to a first preferred embodiment of the present invention.

Reference will now be made in detail to the preferred embodiments of the present invention, examples of which are illustrated in the accompanying drawings.

First Preferred Embodiment

The present invention provides according to a first preferred embodiment a transport apparatus for holding and transporting a conductive, planar object without contacting the object. The transport apparatus includes at least one pair of first electrodes located above an upper surface of the object, each of the at least one pair of first electrodes having two electrodes opposite each other and carrying a potential difference therebetween to induce charges of opposite polarity on the upper surface of the object that faces the pair of first electrodes. The transport apparatus according to the first preferred embodiment also includes at least three pairs of second electrodes located above the upper surface of the object, each of the three pairs of second electrodes having two electrodes opposite each other and carrying a potential difference therebetween to induce a current in the upper surface of the object that faces the pair of second electrodes. The transport apparatus according to the first preferred embodiment further includes a magnetic field generator for generating magnetic fields in directions perpendicular to the directions of the currents induced in the object by the at least three pairs of second electrodes; at least three horizontal displacement sensors for measuring the position of the object in a two-dimensional plane substantially parallel to the upper surface of the object; and a controller controlling the potential difference applied to each of the at least three pairs of second electrodes and the intensities of the magnetic fields generated by the magnetic field generator in accordance with the position of the object measured by the horizontal displacement sensors.

In the transport apparatus according to the first preferred embodiment of the invention, a potential difference is applied to each pair of the first electrodes to produce an electrostatic force between the object and the electrodes. The forces are attraction forces to the object to keep it floating. Further, a potential difference is applied to each pair of the second electrodes to produce a current in the object. The current interacts with the magnetic field generated by the magnetic field generator to drive the object in a certain driving direction. The position of the object in the two-dimensional plane relative to the carrying surface of the apparatus is measured by the horizontal displacement sensors. The controller controls the potential difference applied to each pair of second electrodes, and the intensity of the magnetic field generated by the magnetic field generator, based on results of measurements of the displacement sensors, to drive or move the object to a desired position. Thus, the transport apparatus can hold the object without contact, and therefore does not suffer from reduction in the yield due to dust and others attached to the object. At the same time, the transport apparatus can accurately control the position of the object during its transportation.

The current flowing in the object interacts with the magnetic field generated by the magnetic field generator to produce a drive force for driving the object. This drive force is a so-called Lorentz force which is applied in a direction perpendicular to those of the current and the magnetic flux when the magnetic flux is generated in a direction perpendicular to that of the current (Fleming's left-hand rule).

In the transport apparatus according to the first preferred embodiment of the invention, the above-indicated at least three pairs of second electrodes may comprise at least two pairs of electrodes for causing current to flow in a first direction in corresponding portions of the object that face these electrodes, due to the potential difference applied to the electrodes, and at least one pair of electrodes for causing current to flow in a second direction different from the first direction in a corresponding portion of the object that face these electrodes.

In the above arrangement, at least two pairs of second electrodes, out of at least three pairs of second electrodes, are oriented in the same direction so that at least two currents flow in the same direction in the portions of the object that face these electrodes (the direction of the current is reversed if the two pairs of electrodes are given the opposite polarities). If these two pairs of electrodes produce the currents in the same direction, and the magnetic fields are produced in the same direction perpendicular to that of flow of the currents, drive forces are exerted on the object at two different points in the same direction, so that the object is moved in the direction in which the drive forces are applied. If the direction of the current produced by these two pairs of electrodes is reversed, or the direction of the magnetic flux is reversed, the object is moved in the direction opposite to the above-indicated direction. Further, if the direction of the current produced by one of the two pairs of electrodes is reversed, or the direction of the magnetic flux corresponding to one of the two pairs of electrodes is reversed, drive forces are exerted at two difference points in the opposite directions, thereby rotating the object about the Z-axis (yawing direction). The direction of the rotation of the object is reversed if the directions of the drive forces exerted by the two pairs of electrodes are reversed.

Since at least one pair of the second electrodes produce current in a different direction from that of the current produced by the above-indicated at least two pairs of electrodes, the object may be driven in the Y-axis direction different from the X-axis direction, for example, and the drive forces in the X-axis and Y-axis directions may be combined to freely move the object in the plane parallel to the carrying surface of the transport apparatus.

Since the object that is kept floating in a non-contact state can be freely driven in the plane of the carrying surface in the X-axis and Y-axis directions or yawing direction, for example, by means of the above-indicated pairs of second electrodes and magnetic field generator, the position of the object can be controlled as desired with high accuracy and reliability.

In the transport apparatus according to the first preferred embodiment of the invention, the potential difference applied to each pair of second electrodes may be a time-varying potential difference whose polarity is alternately reversed at a predetermined frequency.

In this arrangement, the potential difference that alternately varies between positive (+) and negative (−) is applied to between each pair of the second electrodes at a regularly recurring interval of time, so that charges of the opposite polarity appear due to electrostatic induction on the surface of the object that faces these electrodes, with a result of currents generated by potential differences produced in the object. The direction of the current thus generated is periodically reversed. If the direction of the magnetic field (alternating magnetic field) generated by the magnetic field generator is varied in accordance with the timing of the reversal of the current (alternating potential) to control the direction of the drive force or Lorentz force acting on the object to be constant at all times, the object can be continuously driven in a certain direction.

The first preferred embodiment of the present invention will be described in detail, referring to FIG. 1 through FIG. 5. FIG. 1 schematically shows the entire construction of an exposure apparatus 10 according to a first preferred embodiment of the invention. The apparatus 10 is a reduction projection exposure apparatus (so-called wafer stepper) that operates in a step-and-repeat mode to project a pattern image formed on a reticle (mask), onto a shot region of a wafer W (photosensitive substrate), through a projection optical system. The exposure apparatus 10 includes a base 12 horizontally placed on the floor; a surface plate 16 installed over the base 12 through four vibration-damping pads 14; a stage device 20 disposed on the surface plate 16; a first column 18 fixed to the surface plate 16 and extending over the stage device 20; and a projection optical system PL held by the first column 18. The exposure apparatus 10 further includes a second column 22 fixed on the first column 18 and extending over the projection optical system PL; a reticle holder 24 mounted on the second column 22 for holding a reticle R; and an illumination system 26 disposed above the reticle holder 24.

The stage device 20 includes a Y stage 28Y that is movable on the surface plate 16 in the Y-axis direction (the direction perpendicular to the plane of the sheet of FIG. 1);

an X stage 28X that is movable in the X-axis direction (the lateral direction in FIG. 1) perpendicular to the Y axis; and a drive system 29 for driving the Y stage 28Y and X stage 28X in their respective movable directions. The stage device 20 further includes a vertical tilting mechanism 30 mounted on the X stage 28X, and a substrate table 32 that can be driven by the vertical tilting mechanism 30 in the Z-axis (vertical axis) direction perpendicular to the XY plane, and in the rotational directions about the X axis and Y axis.

A wafer holder 34 is mounted on the substrate table 32 through a θ table (not shown), and the wafer W is fixed by vacuum suction on this wafer holder 34. A mirror 36 is fixed to an end portion of the substrate table 32, and a laser interferometer 38 is provided for measuring the position coordinates of the substrate table 32 in the XY two-dimensional directions through the mirror 36, i.e., for measuring XY coordinates of a shot region on the wafer W. The mirror 36 and the laser interferometer 38 together constitute a laser interferometer system. As shown in the schematic plan view of FIG. 2, the apparatus 10 actually includes a Y-axis mirror 36Y extending in the X-axis direction and an X-axis mirror 36X extending in the Y-axis direction, and also includes a Y-axis laser interferometer 38Y coupled to the Y-axis mirror 36Y and an X-axis laser interferometer 38X coupled to the X-axis mirror 36X. These mirrors and interferometers are collectively represented by the mirror 36 and the laser interferometer 38 in FIG. 1.

The reticle holder 24 can be minutely driven by a drive system 25 in the XY two-dimensional directions, and in the θ direction (rotational direction about the Z-axis). When aligning the reticle R held by the reticle holder 24, the position of the reticle holder 24 in the XY plane is controlled through the drive system 25 such that the center of the pattern of the reticle R (reticle center) coincides with the optical axis of the projection optical system PL.

The projection optical system PL is supported by the first column 18 such that its optical axis extends in the Z-axis direction perpendicular to the XY plane. In this embodiment, a both-side telecentric system having a predetermined reduction ratio (¼, for example) is used as the projection optical system PL. Thus, when the reticle R is illuminated by illuminating light emitted from the illumination system 26 with the reticle R and wafer W aligned with each other, a reduced image of a pattern on the patterned surface of the reticle R is transferred to the shot region on the wafer W.

Figure 2:
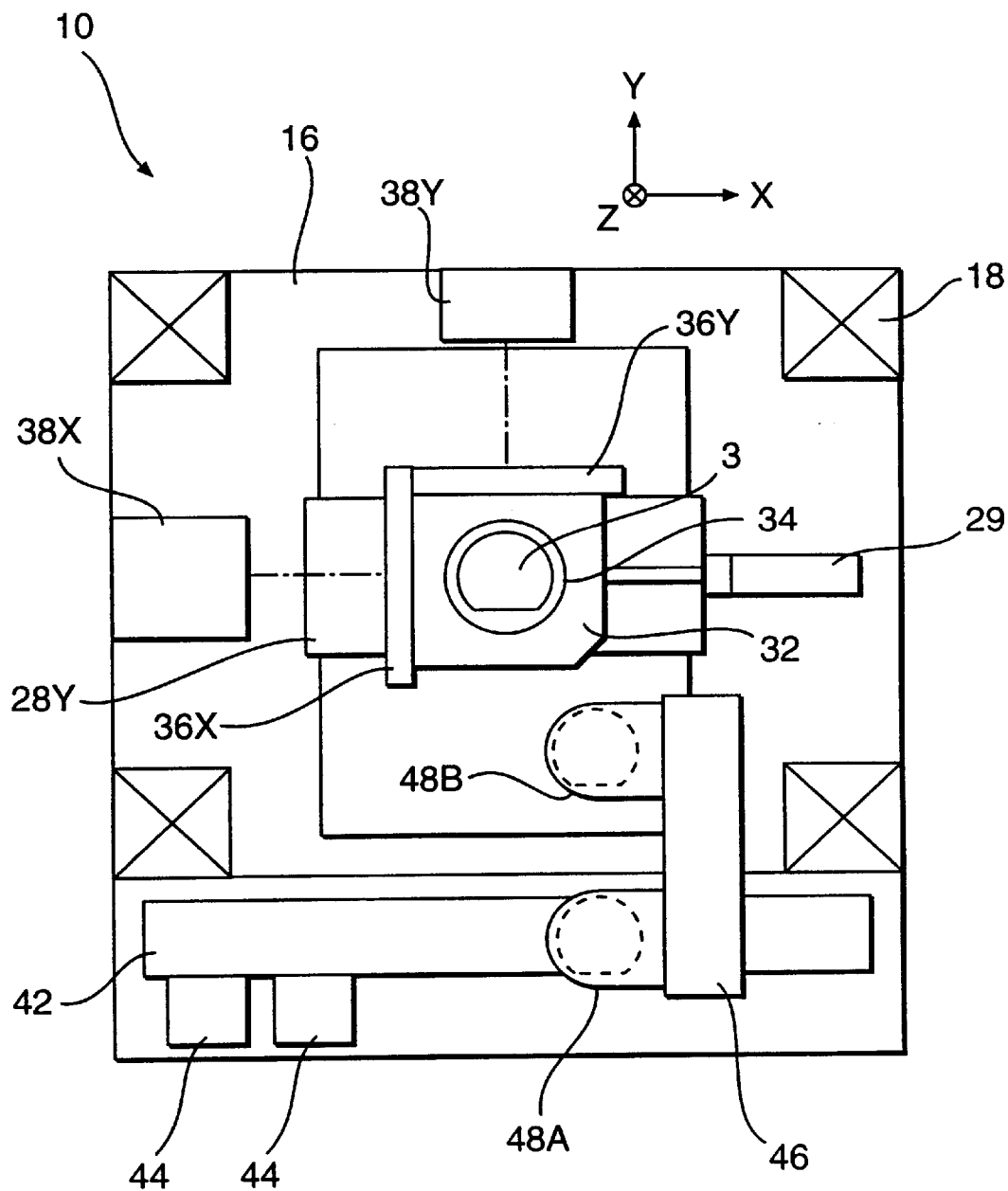
FIG. 2 is a plan view showing the exposure apparatus of FIG. 1 in which an upper plate of a first column and other components located above are removed.

FIG. 2 is a plan view schematically showing the exposure apparatus 10 in which the upper plate of the first column 18 and other components located above the upper plate are removed. As shown in FIG. 2, an X-axis guide 42 extending in the X-axis direction is disposed on the front side (the lower side in FIG. 2) of the first column 18, and two wafer cassettes 44 are disposed on the front side of the X-axis guide 42. A Y-axis guide 46 is installed to cross the X-axis guide 42 at a right angle, and is movable along the X-axis guide 42 through a wafer loader drive system (not illustrated). The Y-axis guide 46 is provided with a transport arm (load arm) 48A for loading the wafer, and another transport arm 48B (unload arm) for unloading the wafer. These transport arms 48A, 48B are movable along the Y-axis guide 46. The load arm 48A and unload arm 48B are also driven by the wafer loader drive system (not illustrated). The plane in which the load arm 48A is movable is located higher than the plane in which the unload arm 48B is movable. This is because dust and other foreign objects are less likely to float in the air at the higher position, and such dust and the like should be prevented from attaching to a resist (photoresist) on the surface of the wafer carried by the load arm 48A since the resist has not been cured before exposure to light.

Figure 3:
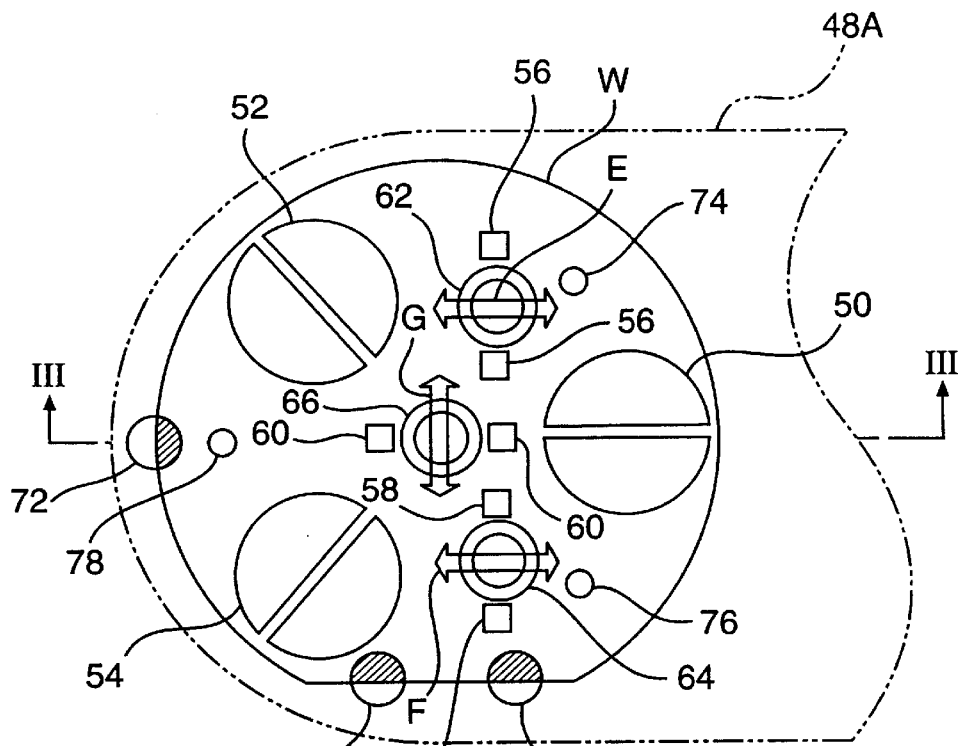
FIG. 3 is a plan view showing the construction of a load arm of a transport apparatus of the first preferred embodiment of the invention.
Figure 4:
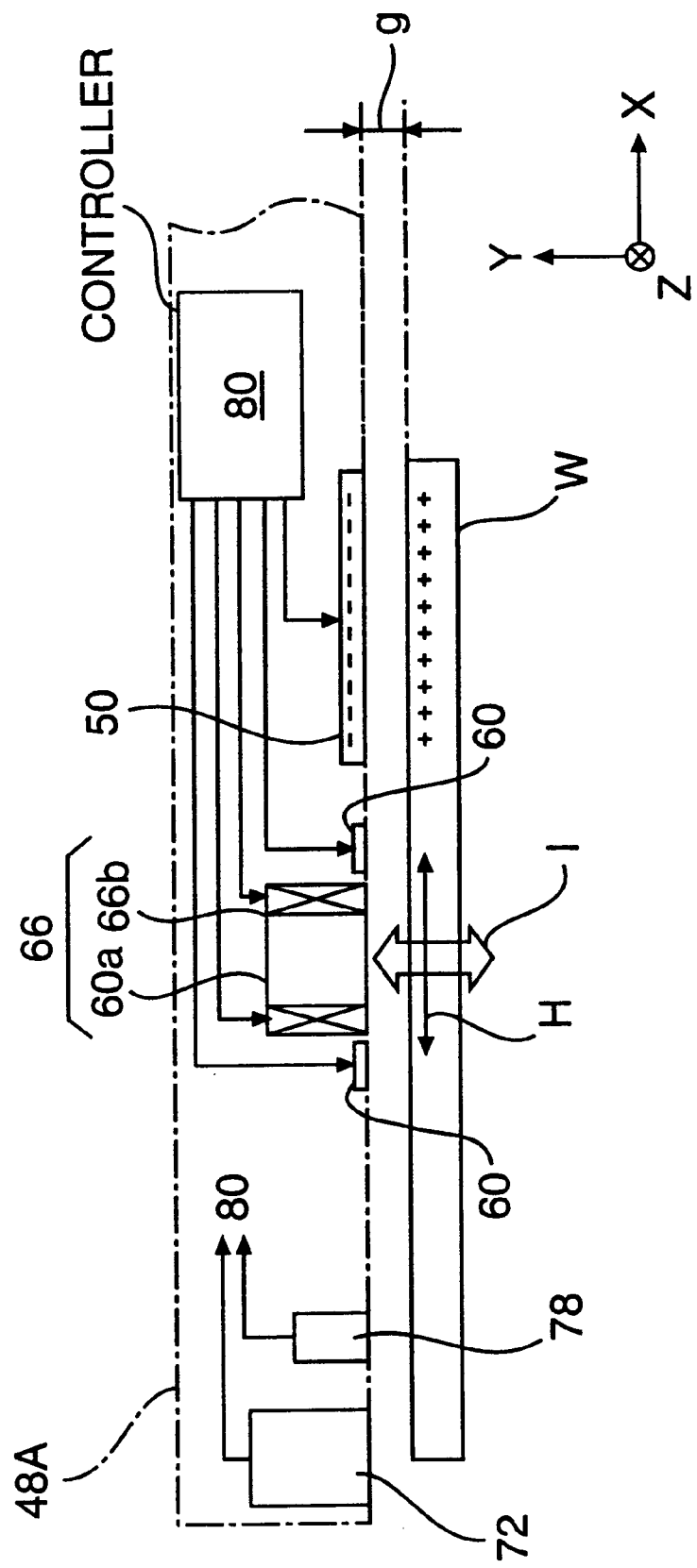
FIG. 4 is a cross-sectional view taken along line III—III of FIG. 3.

FIG. 3 shows the construction of the load arm 48A as the transport apparatus according to the first embodiment of the invention. FIG. 4 is a cross-sectional view taken along line III—III of FIG. 3. The load arm 48A as shown in FIGS. 3 and 4 includes floating-use electrode pairs 50, 52, 54 as first pairs of electrodes for floating the wafer W; horizontal driving electrode pairs 56, 58, 60 as second pairs of electrodes for driving or moving the wafer W in horizontal directions (driving-use electrode pairs); magnet devices 62, 64, 66 as magnetic field generators; horizontal displacement sensors 68, 70, 72; Z-direction (vertical) displacement sensors 74, 76, 78; and a control device 80 as controller.

Each of the floating-use electrode pairs 50, 52, 54 is constructed of a pair of half-moon shaped electrodes disposed on the bottom surface of the load arm 48A. The two electrodes are opposed to each other with a given spacing therebetween. To maintain the balance when holding the wafer W, the centers of these three pairs of floating-use electrodes 50, 52, 54 are located at the respective apexes of a substantially equilateral triangle. When a potential difference of a predetermined bias (direct voltage) is applied between each pair of the floating-use electrodes 50, 52, 54 to charge the pair of electrodes positive (+) or negative (−), oppositely polarized charges are induced due to electrostatic induction on the surface of the wafer W that faces the relevant pair of electrodes with a certain spacing. Thus, the electrostatic attraction force for attracting and floating the wafer W is generated by applying the potential difference to the floating-use electrode pairs 50, 52, 54. This electrostatic attraction force is controlled to be balanced with the self-weight of the wafer W, so that the wafer W is kept floating in the air without contacting the load arm 48A, as shown in FIG. 4. This attraction force is a non-linear force that is inversely proportional to the square of the gap g between the floating-use electrode pairs 50, 52, 54 and the wafer W (FIG. 4). This gap g is constantly detected by the Z-direction displacement sensors 74, 76, 78, and the potential difference applied to each floating-use electrode pair is controlled by the control device 80. The control device 80 controls the spacing between the load arm 48A and the wafer W to be constant. The gap g is generally in the range of several Am to several hundreds of μm.

Although three pairs of electrodes 50, 52, 54 are provided as the floating-use electrode pairs in the first preferred embodiment, the number of pairs of electrodes is not limited to three. The number and the position of electrodes may be selected as desired provided these electrodes are able to stably apply attraction forces to the wafer W while keeping it floating. For example, two pairs or less or four pairs or more of the floating-use electrode pairs may be employed. Alternatively, in order to balance the attraction force exerted by the electrode pairs with the self-weight of the wafer W, air may be blown toward the wafer. The amount of the air may be controlled to maintain the wafer W and the load arm 48A in a non-contact state with a constant spacing therebetween.

Each of the horizontal driving electrode pairs 56, 58, 60 is a pair of rectangular electrodes that are disposed on the lower surface of the load arm 48A such that the two electrodes are opposed to each other with a predetermined spacing therebetween. Of these three pairs of horizontal driving electrodes 56, 58, 60, two pairs of electrodes 56, 58 are arranged in the Y-axis direction, while the other one pair of electrodes 60 are arranged in the X-axis direction in FIG. 3. Thus, at least three pairs of electrodes are provided for driving the wafer W in horizontal directions in this embodiment. In operation, time-varying potential differences (time-varying voltage difference) are applied to the horizontal driving electrode pairs 56, 58, 60. In the present embodiment, the alternating potentials (AC voltages) are applied to the electrode pairs 56, 58, 60 such that the polarity of the potential is periodically reversed between positive (+) and negative (−) at a predetermined frequency. When such alternating potentials are applied to the horizontal driving electrode pairs 56, 58, 60, oppositely polarized charges are induced due to electrostatic induction on the surface of the wafer W that faces the electrodes with a certain spacing, and the charges thus induced also periodically vary with the time-varying potentials applied to the electrodes. As a result, a current is generated due to a potential difference that appears in a portion of the wafer W located between the relevant pair of horizontal driving electrodes. The direction of the current generated in the wafer W is alternately reversed in the frequency corresponding to that of the alternating potential applied to the corresponding pair of horizontal driving electrodes 56, 58, 60.

The magnet devices 62, 64, 66 are disposed between the respective pairs of the horizontal driving electrodes 56, 58, 60 as magnetic field generators for generating magnetic fields of predetermined strength and direction. For instance, the magnet device 66 may be constructed of an iron core 66a and a coil 66b wound around the core 66a, as shown in FIG. 4. The other magnet devices 62, 64 are similarly constructed. The coil 66b is wound around the iron core 66a in the rotational direction about the Z-axis to produce a magnetic flux in the direction perpendicular to the plane of the wafer W (in the Z-axis direction: direction of the arrow "I" in FIG. 4) perpendicular to the direction of the current generated in the wafer W by the horizontal driving electrode pairs 60 (indicated by the arrow "H" in FIG. 4). The other magnetic devices 62, 64 produce magnetic flux in a similar manner. The direction of the magnetic flux generated by the magnet device 66 is determined by the way of winding the coil 66b around the iron core 66a (clockwise or counterclockwise) and the direction of the current flowing through the coil 66b. In the case of generating a time-varying magnetic field, in which the direction of the magnetic flux is periodically varied, the direction of the current flowing through the coil 66b is reversed at a predetermined frequency, for example.

Each of the horizontal driving electrode pairs 56, 58, 60 induces a current in the wafer W, and the corresponding magnet devices 62, 64, 66 produces a magnetic flux in the direction perpendicular to the direction of the current thus generated, whereby a Lorentz force for driving the wafer W is generated by the interaction between the current and the magnetic flux. When the direction of the current is perpendicular to the direction of the magnetic flux, the Lorentz force is generated in the wafer W in a direction perpendicular to both the direction of the current and the direction of the magnetic flux, namely, in the direction indicated by the arrows "E", "F", "G" in FIG. 3 (Fleming's left-hand rule).

Since the direction of the current induced in the wafer W is periodically reversed at a predetermined frequency by alternating electric potentials applied to the horizontal driving electrode pairs 56, 58, 60, the wafer W can be moved in a desired direction by causing the magnet devices 62, 64, 66 to generate time-varying magnetic fields such that the direction of the magnetic flux varies periodically in accordance with the frequency of the current induced in the wafer. Thus, the wafer W held in the air in the non-contact state can be freely driven in the horizontal plane by the Lorentz forces generated by the horizontal driving electrode pairs 56, 58, 60 and the magnet devices 62, 64, 66.

Control of the driving direction of the wafer W will be explained in more detail. As shown in FIG. 3, the Lorentz forces can be generated in the directions of the arrows E, F, G by the respective pairs of horizontal driving electrodes and the corresponding magnetic devices. If the Lorentz forces represented by the arrows E, F are applied to the wafer W in the same direction, the wafer W can be moved in the X-axis direction (right-to-left direction in FIG. 3). If the Lorentz forces represented by the arrows E, F are applied to the wafer W in the opposite directions, on the other hand, the wafer W can be rotated around the Z-axis (clockwise or counterclockwise in FIG. 3).

Further, by using the pair 60 of horizontal driving electrodes that are arranged in a different direction than the other two electrode pairs 56, 58, the water W can be moved in the Y-axis direction by the Lorentz force applied to the wafer W in the direction of the arrow G in FIG. 3. Moreover, the Lorentz forces for driving the wafer W in the X-axis and Y-axis directions can be concurrently applied to the wafer W to drive the wafer W in the direction of the combined Lorentz forces.

In the present embodiment, insulating films formed of silicon nitride, for example, are formed on the surfaces of the above-described floating-use electrode pairs 50, 52, 54 and horizontal driving electrode pairs 56, 58, 60. In the presence of such insulating films, short-circuiting, or other problems can be avoided even if the wafer W (conductive body) contacts any of the electrode pairs by mistake. These problems are avoided even when a high voltage is applied to the electrode pair.

The horizontal displacement sensors 68, 70, 72 measure the position of the wafer W with respect to the wafer-carrying plane of the load arm 48A, without contacting the wafer W. In the present embodiment, electrical capacitance displacement sensors, which measure the displacement of the wafer W using electrostatic capacitance, are used as the horizontal displacement sensors 68, 70, 72. Generally, the electrical capacitance displacement sensor detects the electrostatic capacitance C that varies in accordance with the positional relationship (overlap area of an electrode of the displacement sensor and the wafer W and a distance between the electrode and the wafer W) between two conductive bodies (the electrode of the displacement sensor and the wafer W) facing each other through a dielectric (space between the displacement sensor and the wafer W in this case). The positional relationship between the displacement sensor and the wafer W (or displacements of the wafer W) can be obtained based on the electrostatic capacitance C thus detected. The electrostatic capacitance C is generally represented by the following equation (1):

$$C = \epsilon_s \cdot \epsilon_0 \cdot S/D. \quad (1)$$

where S is the area of the electrodes forming the capacitor, D is a distance between the electrodes, $\epsilon_0 (=8.854 \times 10^{-12} \, F/m)$ is the permittivity of free space, and $\epsilon_s$ is the dielectric constant of the dielectric. In the expression (1), the permittivity of free space $\epsilon_0$ and the dielectric constant $\epsilon_s$ of the dielectric are known constants. If the distance D between the electrodes is controlled to be constant, for example, the electrode area S can be obtained from the following equation (2) if the electrostatic capacitance C is detected:

$$S = C \cdot D / (\epsilon_s \cdot \epsilon_0). \quad (2)$$

Namely, the overlap area S of the electrode portion of the displacement sensor and the wafer W (hatched portions of the horizontal displacement sensors 68, 70, 72 of FIG. 3) can be easily obtained merely by measuring the electrostatic capacitance C.

As shown in FIG. 3, the horizontal displacement sensors 68, 70 are disposed such that one half of each meter 68, 70 overlaps with a straight edge (orientation flat) of the wafer W when the wafer W is placed in its normal position, and the horizontal displacement sensor 72 is disposed at a point in the peripheral portion of the wafer W. Two or more displacement sensors 72 may be provided in the round peripheral portion. These horizontal displacement sensors 68, 70, 72, disposed at three points along the periphery of the wafer W, accurately and easily detect changes in the position of the wafer W in the horizontal directions (X and Y directions), since the overlap areas S of the electrodes of the displacement sensors with the wafer W can be obtained merely by measuring the electrostatic capacitance at the respective points.

Furthermore, the rotational angle θ of the wafer W about the Z-axis can be obtained by measuring the displacements of the wafer W with respect to the two horizontal displacement sensors 68, 70 that face the orientation flat (straight edge) of the water W.

The Z-direction displacement sensors 74, 76, 78 are adapted to measure a distance between the wafer W and the lower surface of the load arm 48 and the inclination of the wafer W with respect to the lower surface without contacting the wafer W. Electrical capacitance displacement sensors similar to the horizontal displacement sensors 68, 70, 72 are used as the Z-direction displacement sensors 74, 76, 78. Each of the electrical capacitance displacement sensors 74, 76, 78 derives the distance D between the two electrodes of the capacitor (displacement in the Z-axis direction), according to the following expression (3), which is a modification of the above expression (1):

$$D=\epsilon_s \cdot \epsilon_0 \cdot S/C. \qquad (3)$$

That is, the overlap area S between the electrode of the displacement sensor and the wafer W is equal to the entire area of the electrode, as is apparent from FIG. 3. Therefore the distance D (gap g) between the electrode of the displacement sensor and the wafer W can be easily obtained by measuring the electrostatic capacitance C.

The Z-direction displacement sensors 74, 76, 78 are located a predetermined distance from the periphery of the wafer W with a suitable spacing therefrom, so that the entire areas of the displacement sensors 74, 76, 78 are always located in the interior of the wafer W (with no changes in the overlap area S between the Z-direction displacement sensor and the wafer W), even if the wafer W is slightly shifted from the normal position. Also, the Z-direction displacement sensors 74, 76, 78 are disposed at the positions of the apexes of a substantially equilateral triangle, so that the inclination of the wafer W about the X-axis or Y-axis (rolling amount, pitching amount) can be easily obtained on the basis of the measured distances D between the displacement sensors and the wafer W.

The control device 80 (controller) is connected to the above-described elements of the load arm 48A to control the operation of the entire load arm 48A, as shown in FIG. 4. In particular, the control device 80 controls the potential differences (voltage differences) applied to the horizontal driving electrode pairs (second electrode pairs) 56, 58, 60 and magnetic fields generated by the magnet devices (magnetic field generator) 62, 64, 66, based on outputs of the respective horizontal displacement sensors 68, 70, 72 in such a way that the wafer W is always placed in a desired position in the horizontal plane relative to the load arm 48A, for example. The control device 80 also adjusts the potential differences (voltage differences) applied to the floating-use electrode pairs (first electrode pairs) 50, 52, 54 by feedback control, based on outputs of the Z-direction displacement sensors (vertical displacement sensors) 74, 76, 78 in such a way that the load arm 48A and the wafer W are separated with a constant spacing in between (several μm to several hundreds of μm), maintaining a non-contact state.

Figure 5:
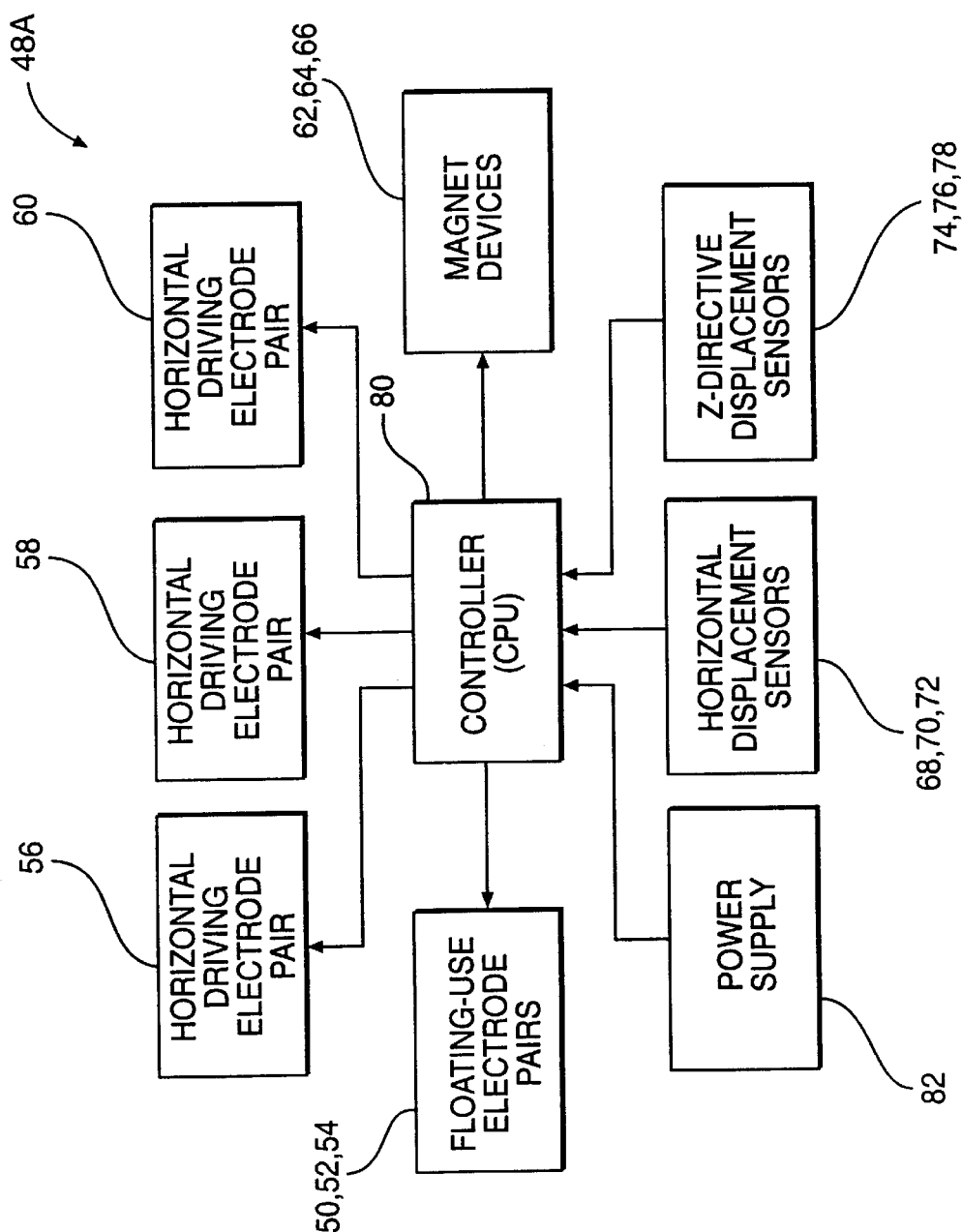
FIG. 5 is a block diagram showing the schematic operation of the load arm of the first preferred embodiment.

FIG. 5 is a block diagram showing connection of the various elements of the load arm 48A. As shown in FIG. 5, the control device 80 includes a microcomputer (or minicomputer) having CPU (central processing unit), ROM, RAM, etc. and receives signals output from some elements of the arm 48A and outputs signals to other elements. The above-described horizontal displacement sensors 68, 70, 72, Z-direction displacement sensors 74, 76, 78, and a power supply unit 82 for generating various levels of currents and voltages, etc. are connected to the input side of the control device 80. The floating-use electrode pairs 50, 52, 54, the horizontal driving electrode pairs 56, 58, 60, and the magnetic devices 62, 64, 66 are connected to the output side of the control device 80. As described above, the floating-use electrode pairs 50, 52, 54 are used for applying attraction forces to the wafer W to float the wafer. The horizontal driving electrode pairs 56, 58, 60 are used for generating currents in the wafer W to drive the wafer in horizontal directions and to rotate the wafer, and the magnetic devices 62, 64, 66 are used for generating magnetic fields to apply Lorentz forces to the wafer W due to the interaction of the magnetic fields and the currents flowing in the wafer W.

In the present embodiment, the power supply unit 82 produces time-varying electric potentials (voltages) to be applied to the horizontal driving electrode pairs 56, 58, 60 as alternating electric potentials whose polarity is periodically reversed; bias potentials (DC voltage) as electric potentials to be applied to the floating-use electrode pairs 50, 52, 54; and currents to be provided to the coils of the magnetic devices 62, 64, 66 in predetermined directions. The thus produced voltages and currents are supplied to the corresponding elements of the load arm 48A.

Operation of transporting the wafer W using the load arm 48A according to the first preferred embodiment constructed above will be described below in more detail.

Before the exposure apparatus 10 performs exposure operations on the wafer W, a wafer W is picked up from the wafer cassette 44 by the load arm 48A through the wafer loader drive system (not shown) upon receipt of a wafer supply command from a control system (not shown), and then is transported to a predetermined wafer-receiving position.

The load arm 48A is moved to a position above the wafer W inserted in the wafer cassette 44 such that the arm 48A and the wafer W are spaced a predetermined distance from each other. When a suitable potential difference generated by the power supply unit 82 is applied to each of the floating-use electrode pairs 50, 52, 54 of the load arm 48A thus positioned, charges of the opposite polarity are induced on portions of the wafer surface that faces the electrode pairs 50, 52, 54. Therefore, the wafer W is attracted toward the load arm 48A and floats due to the electrostatic attraction force appearing between the different kinds (polarities) of charges.

The same potential difference is normally applied to the floating-use electrode pairs 50, 52, 54 so that the same electrostatic attraction force is uniformly applied to the wafer W, keeping it floating without inclining. If the electrostatic attraction force is larger than the self-weight of the wafer W, however, the wafer W may be attracted too much and contact with the load arm 48A. If the self-weight of the wafer W is larger than the electrostatic attraction force, on the other hand, the wafer W falls down. To keep the spacing between the wafer W and the load arm 48A in a suitable range (several μm to several hundreds of μm), the control device 80 constantly adjusts potential differences applied to the respective floating-use electrode pairs 50, 52, 54 by feedback control in accordance with the measurement values of distances (displacements) between the wafer W and the load arm 48A at the respective positions of the Z-direction displacement sensors 74, 76, 78. In this manner, the load arm 48A controls the displacements of the wafer W in the Z-direction and the rotation around the X-axis and Y-axis without contacting the wafer W to keep the distance between the arm 48A and the wafer W constant all the time.

Since the load arm 48A of the first preferred embodiment holds the wafer W without contact using the floating-use electrode pairs 50, 52, 54, the wafer W may rotate around the Z-axis or move in the X-axis or Y-axis direction within the horizontal plane during transportation of the wafer W by the load arm 48A and the Y-axis guide 46. To solve this problem, the control device 80 constantly detects the position of the wafer W in the non-contact state through the horizontal displacement sensors 68, 70, 72. When the wafer W is shifted from its normal (or design) position, the control device 80 applies time-varying electric potential differences (time-varying voltage differences) to the horizontal driving electrode pairs 56, 58, 60, and causes the magnet devices 62, 64, 66 to generate alternating magnetic fields (AC magnetic fields) whose directions change periodically in accordance with variations in the potentials to produce three Lorentz forces to return the wafer W to the normal position.

When a time-varying potential difference is applied to each of the horizontal driving electrode pairs 56, 58, 60 to cause a current to flow in the portion of the wafer W that faces the relevant electrode pair and the magnetic field is generated by the corresponding magnet device 62, 64, 66 in the direction perpendicular to that of the current, the direction of the magnetic flux needs to be changed in accordance with changes in the direction of the current. This is because the Lorentz force acts on the wafer W in a direction perpendicular to the directions of the current and the magnetic field.

Since the load arm 48A of the first preferred embodiment can securely hold the wafer W in the air without contact by the floating-use electrode pairs 50, 52, 54 applying attraction forces to the wafer W by electrostatic induction, dust and other foreign objects are prevented from attaching to the wafer W. This prevents degradation in the yield in manufacture of semiconductor devices.

The wafer W, which is held by the load arm in the non-contact state, may be undesirably rotated around the Z-axis or shifted in the X-axis or Y-axis direction during the transport operation of the conventional wafer holding method. In the present embodiment, on the other hand, the load arm 48A is capable of controlling the motion of the wafer W in six directions (i.e., translational motions in the X-axis, Y-axis and Z-axis directions and rotational motions about the X-axis, Y-axis and Z-axis) without contacting the wafer W. Therefore, it is possible to accurately transport the wafer W to a predetermined position on the wafer stage by accurately controlling the position of the wafer W to keep it at the normal position in the wafer-carrying plane of the load arm 48A.

Second Preferred Embodiment

According to a second preferred embodiment of the present invention, the present invention provides a transport apparatus for holding and transporting a conductive, planar object which is not in contact with a carrying surface of the apparatus. The transport apparatus according the second preferred embodiment of the present invention includes at least three pairs of electrodes located above an upper surface of the object and facing the object, each pair of first electrodes having two electrodes which are opposed to each other, and to which a potential difference is applied to induce charges of the opposite polarity on a portion of the object which faces the two electrodes, and cause current to flow in the portion of the object. The transport apparatus according the second preferred embodiment also includes magnetic field generator for generating a magnetic field in a direction perpendicular to a direction of flow of the current generated in the object by each pair of electrodes; and at least three horizontal displacement sensors that measure a position of the object in a two-dimensional plane with respect to the carrying surface of the transport apparatus. The transport apparatus according the second preferred embodiment further includes a controller for controlling the potential difference applied to each pair of electrodes and an intensity of the magnetic field, based on an output of each of the horizontal displacement sensors.

In the transport apparatus constructed as described above, potential differences are applied to at least three pairs of electrodes to induce charges of the opposite polarity in the portions of the objects that face these electrodes, so as to apply suction to the object while making it float due to the electrostatic force. At the same time, the electrodes produce currents in the object to drive the object by the interaction of the currents with magnetic fields generated by the magnetic field generator. With the position of the object in the two-dimensional plane relative to the carrying surface being measured by the horizontal displacement sensors, the controller controls the potential difference applied to each pair of the electrodes and the intensity of the magnetic field, based on the position of the object measured by the displacement sensors to move the object to a desired position. The transport apparatus according to the second preferred embodiment of the invention is different from the apparatus according to the first preferred embodiment of the invention in that the above pairs of electrodes have both functions of the electrode pairs (floating-use electrode pairs) for floating the object, and the electrode pairs (driving electrode pairs) for driving the object. Thus, the number of electrodes used in the apparatus can be reduced, and the manufacturing cost can be lowered. By controlling the potential difference applied to each pair of electrodes, the present apparatus is able to hold and transport the object without contacting it, while controlling the object to a desired position.

In the transport apparatus according to the second preferred embodiment of the invention, the above-indicated at least three pairs of electrodes may include at least two pairs of electrodes for causing current to flow in a first direction in corresponding portions of the object that face these electrodes, due to the potential difference applied to the electrodes, and at least one pair of electrodes for causing current to flow in a second direction different from the first direction in a corresponding portion of the object that faces these electrodes.

In the above arrangement, at least two pairs of electrodes, out of at least three pairs of electrodes, are oriented in the same direction so that at least two currents flow in the same direction in the portions of the object that face these electrodes (the direction of the current is reversed if the two pairs of electrodes are given the opposite polarities). As described above, the pairs of electrodes function as the electrode pairs (floating-use electrode pairs) for floating the object, and also as the electrode pairs (driving electrode pairs) for driving the object. If the above two pairs of electrodes produce the currents in the same direction, and the magnetic fields are produced in the portions where the currents flow in the same direction perpendicular to the flow of the currents, the object can be moved in a certain direction in which drive forces produced by the currents and magnetic fields are applied. If the direction of the current produced by these two pairs of electrodes is reversed, or the direction of the magnetic flux is reversed, the object is moved in the direction opposite to the above-indicated direction. Further, if the direction of the current produced by one of the two pairs of electrodes is reversed, or the direction of the magnetic flux corresponding to one of the two pairs of electrodes is reversed, the object can be rotated about the Z-axis (yawing direction). The direction of rotation of the object can be reversed if the directions of drive forces exerted by the two pairs of electrodes are reversed.

Since at least one pair of the electrodes produces current in a different direction from that of the currents produced by the above-indicated at least two pairs of electrodes, the object may be driven in the Y-axis direction different from the X-axis direction, for example, and the drive forces in the X-axis and Y-axis directions may be combined to freely[] move the object in the plane parallel to the carrying surface of the transport apparatus.

The transport apparatus according to the second preferred embodiment of the invention only uses the electrode pairs for floating the object in a non-contact state, and for moving the object to a desired position with high reliability, by freely driving the object in the X-axis and Y-axis directions or yawing direction in the plane parallel to the carrying surface of the apparatus.

In the transport apparatus according to the second preferred embodiment of the invention, the potential difference applied to each pair of electrodes may be a time-varying potential difference whose polarity is alternately reversed at a predetermined frequency.

In the above arrangement, the potential difference that alternately varies between positive (+) and negative (−) is applied to between each pair of the electrodes at a predetermined frequency, so that charges of the opposite polarity appear due to electrostatic induction on the surface of the object that faces these electrodes, and currents flow in the object due to potential differences produced in the object. As a result, the object is attracted and held in a non-contact state by the electrode pairs due to the electrostatic force, and its position is controlled by applying drive forces in certain directions, which forces are caused by interaction of the currents flowing in the object and the magnetic fields generated by the magnetic field generator. Since the direction of the current flowing in the object is periodically reversed, the object may be continuously driven in a certain direction by varying the direction of the magnetic field generated by the magnetic field generator in accordance with the direction of the current (the direction of the drive force is constant all the time).

In one preferred form of the invention, the transport apparatus further includes at least three vertical displacement sensors for measuring a position of the object in a vertical direction perpendicular to the carrying surface of the transport apparatus.

To apply suction to the object while keeping it flowing due to the electrostatic force generated by the electrode pairs located above the object, and hold the object in a non-contact state, the electrostatic force needs to be balanced with the self-weight of the object. To this end, at least three vertical displacement sensors are provided for measuring the spacing between the electrode pairs and the object, so as to calculate displacements of the object in the vertical direction, which relate to the distance between the object and the electrode pairs or the inclination of the object.

In the transport apparatus as described just above, the controller controls the potential applied to each pair of electrodes for generating the electrostatic force in a feedback fashion, based on the amounts of displacement measured by the vertical displacement sensors, so as to constantly hold the object and the electrode pairs in parallel with each other, thus avoiding contact between the object and the transport apparatus without fail.

The second preferred embodiment of the present invention will be described in more detail referring to FIG. 6. The same reference numerals used in the first preferred embodiment will be used to identify the structurally and/or functionally corresponding elements, for which only brief explanation or no explanation will be provided.

Figure 6:
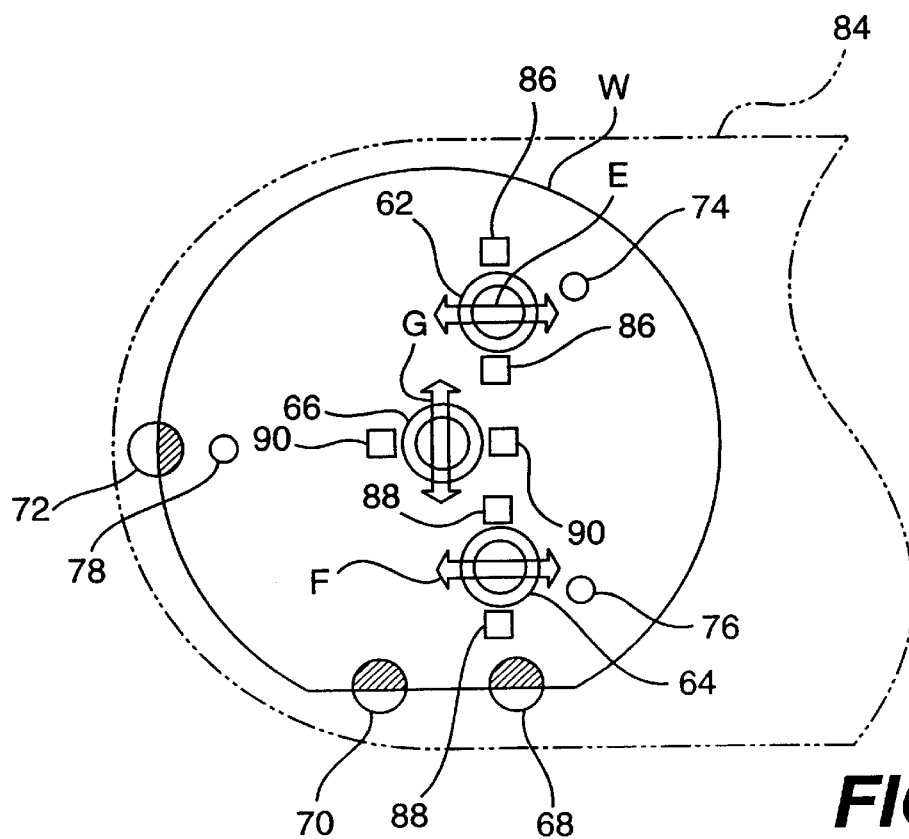
FIG. 6 is a plan view showing the construction of a load arm of a transport apparatus according to a second preferred embodiment of the present invention.

FIG. 6 is a schematic view showing the construction of a load arm 84 as a transport apparatus according to the second preferred embodiment of the invention, which applies an attraction force to a wafer W to float the wafer and control the position of the wafer W. In the second preferred embodiment, the floating-use electrode pairs 50, 52, 54 used in the apparatus of the first preferred embodiment are eliminated, and wafer position control electrode pairs 86, 88, 90 has both functions of the above floating-use electrode pairs and the horizontal driving electrode pairs for driving the wafer W in horizontal directions. The time-varying potential differences to be applied to the electrode pairs 86, 99, 90 are controlled in a different manner from those in the first preferred embodiment. The other parts of the load arm 84 are constructed to be nearly identical to the corresponding parts of the first preferred embodiment.

The wafer position controlling electrode pairs 86, 88, 90, each of which is constructed of a pair of electrodes in this embodiment, are able to freely control the position of the wafer in six directions, namely, three vertical directions (translational position in the Z-axis direction, rotations about the X-axis and the Y-axis) and three horizontal directions (rotation about the Z-axis, and translational position in the X-axis and Y-axis directions). These wafer position control electrode pairs 86, 88, 90 are disposed in the same positions as the horizontal driving electrode pairs 56, 58, 60 of the first preferred embodiment.

To apply attraction forces for floating the wafer, a bias potential (direct-current voltage) is applied to each of the wafer position control electrode pairs 86, 88, 90 so that charges of the opposite polarity are induced on the corresponding surface of the wafer W facing the electrodes due to electrostatic induction. By this induced charges, the wafer W is attracted toward the load arm 84 and is floated due to the electrostatic attraction force applied between the different kinds (polarities) of charges.

To drive the wafer W in horizontal directions while keeping it in a floating, non-contact state, time-varying potential differences (voltage differences) for generating currents in the wafer W are superposed on the potential differences (bias potentials) for floating the wafer W, and these superposed potential differences are applied to the electrode pairs 86, 88, 90. In this manner, currents are induced in the wafer W while maintaining the electrostatic attraction force. When magnetic fields are generated by the magnet devices 62, 64, 66 provided between the respective pairs of the wafer position control electrodes 86, 88, 90 as in the first preferred embodiment, Lorentz forces are generated in the directions of arrows "E", "F" and "G" in FIG. 6, due to the interaction between the currents and the magnetic fields.

Thus, the load arm 84 of the second preferred embodiment is able to securely hold the wafer W in the air without contact by the electrode pairs 86, 88, 90 generating the electrostatic attraction force for floating the wafer W. Accordingly, dust and other foreign objects are unlikely to attach to the wafer W, preventing a problem of reduction in the yield in manufacture of semiconductor devices.

Further, the wafer position control electrode pairs 86, 88, 90 and the magnet devices 62, 64, 66 make it possible to control the motions of the wafer W relative to the load arm 84 in the non-contact state, in six directions (translational motions in the X-axis, Y-axis and Z-directions and rotations about the X-axis, Y-axis and Z-axis). Thus, the position control can be performed with high accuracy, maintaining the wafer W at a normal or fixed position in the wafer-carrying plane of the load arm 84. Accordingly, the wafer W can be accurately transported to the predetermined position on the wafer stage.

Third Preferred Embodiment

In a third preferred embodiment of the invention, each of the displacement sensors is an electrical capacitance displacement sensor that measures a position of the object in an plane parallel to the carrying surface of the transport apparatus, or a position of the object in a vertical direction perpendicular to the carrying surface, based on a change in the electrostatic capacitance between each displacement sensor and the object.

By use of the electrical capacitance type displacement sensor for measuring the position of the object in the carrying surface or in the vertical direction, displacements of the object can be easily and accurately measured with no contact between the object and the displacement sensor.

In the transport apparatus as described just above, each of the displacement sensors may include oscillator for superposing a predetermined carrier frequency on at least one of the pairs of electrodes; frequency detector for detecting a change in the carrier frequency in the oscillator; and position detector for detecting a position of the object based on the change in the carrier frequency detected by the frequency detector.

When the oscillator (oscillation circuit) is connected to the pair of electrodes and the carrier frequency is superposed on the electrodes, the electrostatic capacitance C is changed if the object as the conductive body approaches the pair of electrodes, resulting in a change in the carrier frequency (oscillation frequency) in the oscillation circuit. The frequency detector (phase detecting circuit) detects the amount of the change in the carrier frequency. Thus, the oscillator and frequency detector constitute a displacement sensor for detecting displacements of the object. Namely, the carrier frequency in the oscillation circuit changes as the electrostatic capacitance C changes according to the positional relationship (overlap area between the object and the electrodes and a distance between the object and the electrodes) between the object and the pair of electrodes. Thus, the position of the object can be detected by measuring the amount of changes of the carrier frequency in the oscillation circuit connected to the pair of electrodes.

In the above preferred embodiment of the present invention, separate displacement sensors need not be provided in addition to the electrode pairs. Rather, the electrode pairs can also function as displacement sensors for measuring displacements of the object merely by superposing the carrier frequency on the electrode pairs and by monitoring changes in the oscillation frequency.

To provide the displacement sensor as described above, the position of the electrode pair used as the displacement sensor needs to be taken into consideration. Namely, at least three pairs of electrodes, the entire areas of which always face the object, are desirably used as displacement sensors for measuring displacements of the object in the vertical direction. For measuring displacements of the object in horizontal directions, at least three pairs of electrodes, which intersect the edge of the object in its normal position, are desirably used as horizontal displacement sensors. Since the electrostatic capacitance changes with a change in either the overlapping area of the electrode or the distance between the object and the electrode, the displacements of the object can be calculated by measuring changes in the electrostatic capacitance using the displacement sensors for the vertical and horizontal displacements.

Figure 7:
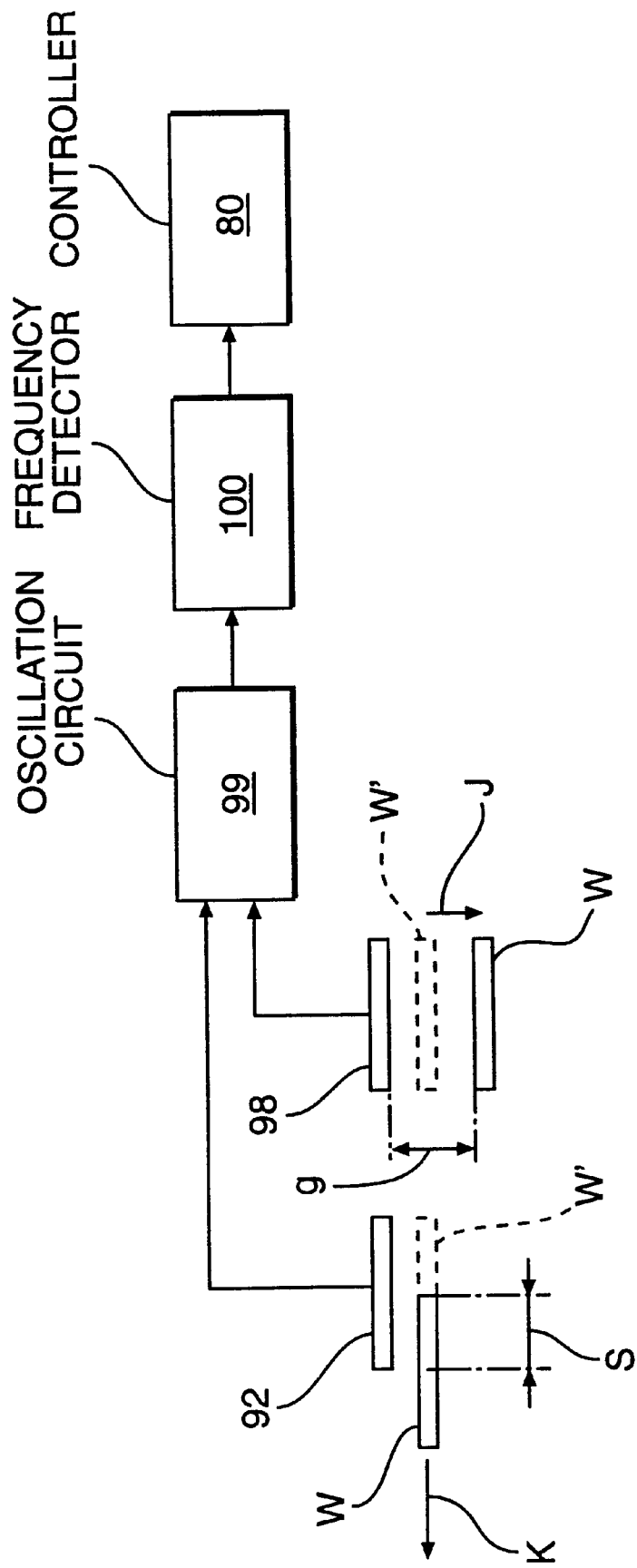
FIG. 7 is a block diagram showing an arrangement for a transport apparatus according to a third preferred embodiment of the invention.
Figure 8:
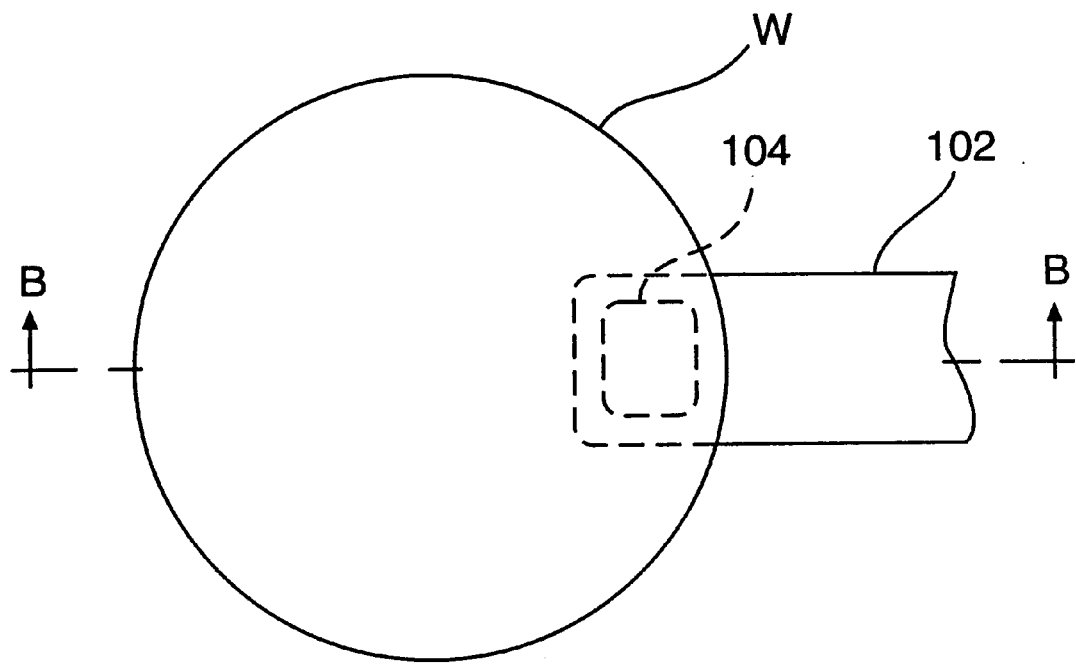
FIG. 8 is a plan view showing a conventional vacuum hand for transporting a wafer.
Figure 9:
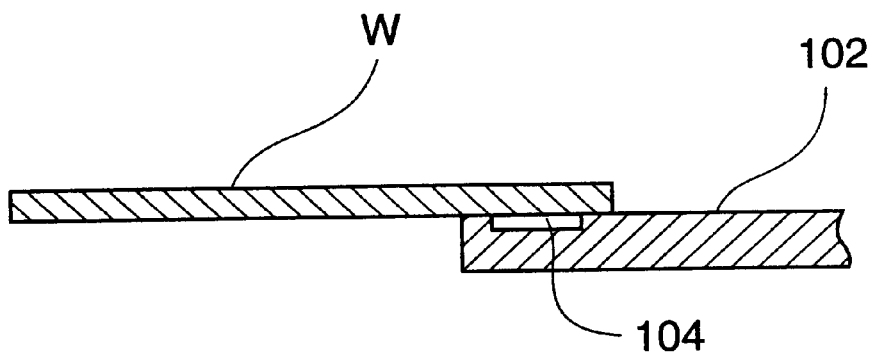
FIG. 9 is a front view of the conventional vacuum hand of FIG. 8.
Figure 10:
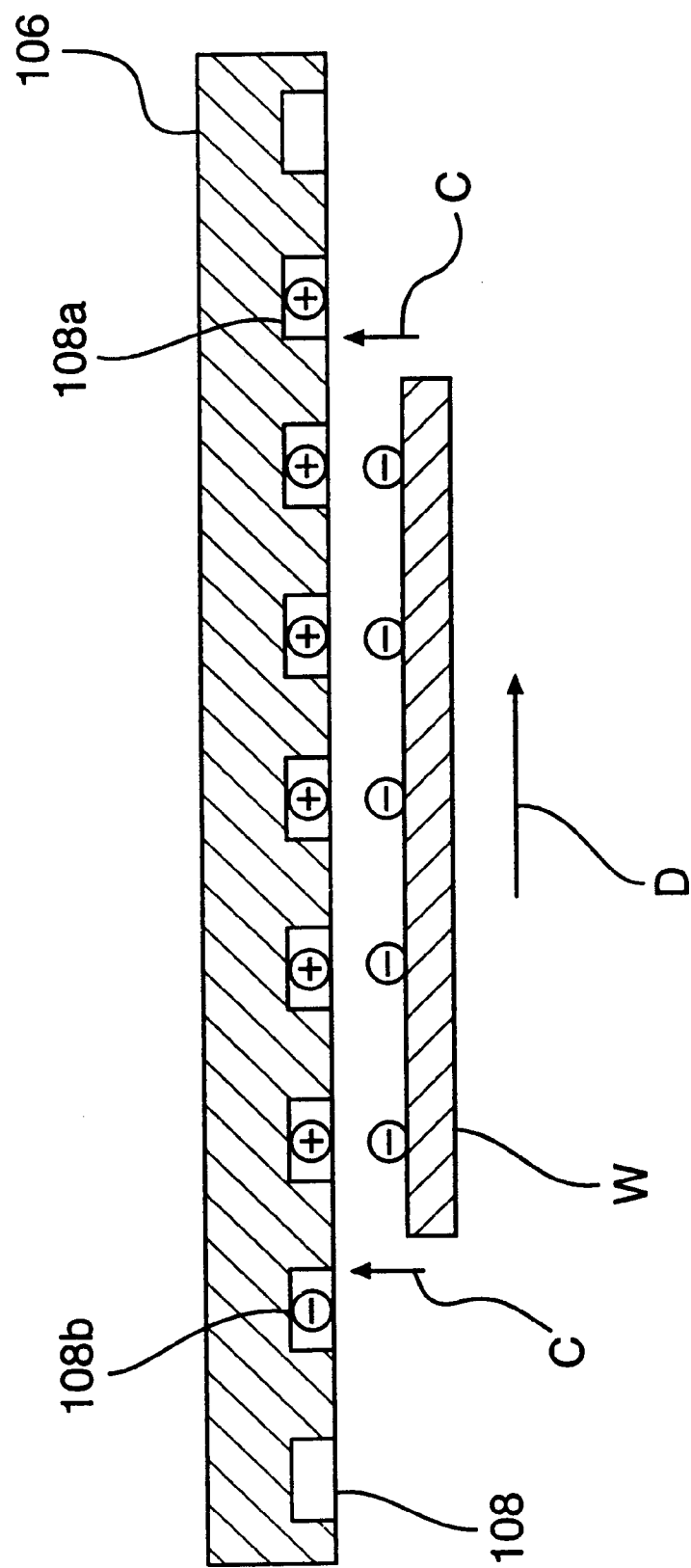
FIG. 10 is a front view of a conventional transport apparatus of electrostatic floating type.

Referring next to FIG. 7, the third preferred embodiment of the present invention will be described in more details. In FIG. 7, the same reference numerals used in the first and second preferred embodiments will be used to identify structurally and/or functionally corresponding elements, for which only brief explanation or no explanation will be provided.

FIG. 7 is a block diagram showing a circuit arrangement for the transport apparatus of the third preferred embodiment. In the third preferred embodiment, the electrode pairs used for floating the wafer W and/or driving the wafer in horizontal directions are also used as horizontal displacement sensors or Z-direction (vertical) displacement sensors. The apparatus of FIG. 7 includes electrode pairs 92, 98, an oscillation circuit 99 as oscillator, a frequency detector 100, and a control circuit 80 as controller. In this third preferred embodiment, an additional time-varying potential of a predetermined carrier frequency is applied to the floating-use electrode pairs 50, 52, 54, horizontal driving electrode pairs 56, 58, 60 of the transport apparatus of the first preferred embodiment, or the wafer position control electrode pairs 86, 88, 90 of the transport apparatus of the second preferred embodiment. Therefore, these electrode pairs can also be used as the horizontal displacement sensors 68, 70, 72 or Z-direction displacement sensors 74, 76, 78. Other parts of the transport apparatus are not shown in FIG. 7, but are identical with the corresponding parts of the first and second preferred embodiments.

The electrode pairs 92, 98 shown in FIG. 7 may correspond to any one of the floating-use electrode pairs 50, 52, 54 and horizontal driving electrode pairs 56, 58, 60 of the first preferred embodiment, or any one of the wafer position control electrode pairs 86, 88, 90. The positions of the respective electrode pairs are not limited to those of the electrode pairs on the load arms 48A, 84 as shown in FIGS. 3 and 6, but are such that the electrode pairs can also be used as the displacement sensors. Namely, when the electrode pairs are used as displacement sensors for measuring displacements of the wafer W in horizontal directions, they need to be disposed at at least three positions intersecting the periphery of the wafer W that is, disposed in the normal position with respect to the load arm 48A (84) and at least two of such electrode pairs need to be disposed at the orientation flat portion of the wafer W to detect the rotational angle $\theta$ of the wafer W about the Z axis. When the electrode pairs are used as displacement sensors for measuring Z-direction displacements of the wafer W, they need to be disposed at at least three positions in the interior of the wafer W spaced a predetermined distance from the periphery of the wafer W that is placed at the normal position with respect to the load arm 48A (84). The electrostatic capacitance C is formed between electrode 92 (98) and the wafer W which is floating with a predetermined spacing with the load arm 48A (84).

The oscillation circuit 99, which is connected to the electrode pairs 92, 98 for forming the electrostatic capacitance C, includes an inductance L therein to form an LC circuit (LC oscillation circuit). If the wafer W approaches the electrode pair 92 or 98, the electrostatic capacitance C changes. As a result, the oscillation frequency (characteristic frequency) of the LC oscillation circuit changes. Since the oscillation frequency of the LC oscillation circuit is determined by the inductance L and the electrostatic capacitance C, changes in the electrostatic capacitance C are directly represented as changes in the oscillation frequency provided the inductance L is constant. In this embodiment, such changes in the characteristic frequency is electrically converted and the position of the wafer is detected.

The frequency detector 100 detects frequency changes in the oscillation circuit 99 and the beginning and the ending of the oscillation, etc., and sends the corresponding detection signals to the control device 80.

The control device 80 processes the signals from the frequency detector 100 indicating the changes in the frequency of the oscillation circuit 99 to detect the position (displacements) of the wafer W.

In the thus constructed transport apparatus, an additional electric potential of high-frequency carrier frequency is superposed on certain electrode pairs 92, 98 mounted on the load arm, as shown in FIG. 7. The electrostatic capacitance C of each electrode pair 92, 98 changes depending upon the position of the wafer W located adjacent the electrode pair. For example, the electrode pair 92 disposed on the periphery of the wafer W may be used as a displacement sensor for measuring the horizontal displacements of the wafer W. If the wafer in the dashed-line position W' is moved to the left (in the direction of arrow "K") to the solid-line position W in FIG. 7, the overlap area S decreases, and the electrostatic capacitance C decreases. The reduction in the electrostatic capacitance C results in a change in the oscillation frequency (carrier frequency) in the oscillation circuit 99. This change is detected by the frequency detector 100 and is processed in the control device 80. This way, the horizontal position of the wafer W relative to the electrode pair 92 can be detected. The load arm is provided with at least three such displacement sensors for detecting horizontal and rotational displacements, so that the horizontal and rotational position of the wafer W is determined based on the displacements detected by the respective displacement sensors.

The electrode pair 98 disposed in the interior of the wafer W may be used as a displacement sensor for measuring displacements of the wafer W in the Z direction (vertical direction). If the wafer in the dashed-line position W' is moved downward (in the direction of arrow "J") to the solid-line position W in FIG. 7, for example, the gap "g" increases, and the electrostatic capacitance C decreases. The reduction in the electrostatic capacitance C results in a change in the oscillation frequency (carrier frequency) in the oscillation circuit 99 as in the case described above. This change is then detected by the frequency detector 100 and is processed in the control device 80. This way, the position of the wafer W in the Z direction relative to the electrode pair 98 can be detected. The load arm is provided with at least three such displacement sensors for measuring displacements in the Z direction, so that the spacing between the load arm and the wafer W and the inclination of the wafer W can be determined based on the displacements detected by the respective displacement sensors.

In the transport apparatus according to the third preferred embodiment of the invention, the floating-use electrode pairs and horizontal driving electrode pairs, or the wafer position control electrode pairs can also be used as horizontal displacement sensors or Z-direction displacement sensors. Thus, it is possible to simplify the structure of the apparatus without degrading its functions, reducing the manufacture cost. Further, when the floating-use electrode pairs are used as the Z-direction displacement sensors, or the horizontal driving electrode pairs are used as the horizontal displacement sensors, the wafer W is driven at the same position as the positions where its position is detected. Thus, this improves the accuracy and controllability of the position of the wafer W.

While the transport apparatus of the illustrated embodiments are adapted to transport or transfer a wafer that has been doped with impurities, the object to be transported is not limited to the wafer, but the transport apparatus of the present invention is applicable to transport any planar, conductive object to accurately control its position without contacting the object.

While the wafer used in the illustrated embodiments is formed with an orientation flat (straight edge), the present invention is applicable to a wafer with a notch, V-shaped cut, or the like.

While all of the displacement sensors are electric capacitance displacement sensors, the present invention is not limited to this type of displacement sensor, but may use photo-electric non-contact displacement sensors for measuring displacements of the object to be transported.

While the present invention is applied to the step-and-repeat type exposure apparatus in the illustrated preferred embodiments, it is to be understood that the invention may be applied to other types of exposure apparatus, such as of step-and-scan type. Further, the transport apparatus of the present invention is not limited to use in the exposure apparatus, but may be suitably used in an apparatus in which a planar, conductive object needs to be transported from one place to the other.

It will be apparent to those skilled in the art that various modifications and variations can be made in the transport apparatus of the present invention without departing from the spirit or scope of the invention. Thus, it is intended that the present invention cover the modifications and variations of this invention provided they come within the scope of the appended claims and their equivalents.

What is claimed is:

1. A transport apparatus for holding and transporting a conductive, planar object without contacting the object, comprising:

at least one pair of first electrodes located above an upper surface of the object, each of the at least one pair of first electrodes having two electrodes opposite each other and carrying a potential difference therebetween to induce charges of opposite polarity on the upper surface of the object that faces the pair of first electrodes;

at least three pairs of second electrodes located above the upper surface of the object, each of the three pairs of second electrodes having two electrodes opposite each other and carrying a potential difference therebetween to induce a current in the upper surface of the object that faces the pair of second electrodes;

a magnetic field generator for generating magnetic fields in directions perpendicular to the directions of the currents induced in the object by the at least three pairs of second electrodes;

at least three horizontal displacement sensors for measuring the position of the object in a two-dimensional plane substantially parallel to the upper surface of the object; and a controller controlling the potential difference applied to each of the at least three pairs of second electrodes and the intensities of the magnetic fields generated by the magnetic field generator in accordance with the position of the object measured by the horizontal displacement sensors.

2. The transport apparatus according to claim 1, wherein the at least three pairs of second electrodes includes at least two pairs of electrodes each inducing the current in the upper surface of the object in a first direction and at least one pair of electrodes inducing the current in the upper surface of the object in a second direction that is different from the first direction.

3. The transport apparatus according to claim 2, wherein the potential difference applied to each of the at least three pairs of second electrodes includes a time-varying potential difference whose polarity is alternately reversed at a predetermined frequency.

4. The transport apparatus according to claim 1, wherein the potential difference applied to each of the at least three pairs of second electrodes includes a time-varying potential difference whose polarity is alternately reversed at a predetermined frequency.

5. The transport apparatus according to claim 1, further comprising at least three vertical displacement sensors, each measuring the position of the object in a vertical direction substantially perpendicular to the upper surface of the object.

6. The transport apparatus according to claim 5, wherein each of the at least three vertical displacement sensors includes an electric capacitance displacement sensor for measuring the position of the object in accordance with a change in electrostatic capacitance.

7. The transport apparatus according to claim 5, wherein each of the at least three vertical displacement sensors includes:
   an oscillator including an electrode facing the object;
   a frequency detector outputting signals indicating a change in oscillation frequency of the oscillator; and
   a processor for processing the signals output from the frequency detector to derive the position of the object.

8. The transport apparatus according to claim 1, wherein each of the at least three horizontal displacement sensors includes an electric capacitance displacement sensor for measuring the position of the object in accordance with a change in electrostatic capacitance.

9. The transport apparatus according to claim 1, wherein each of the at least three horizontal displacement sensor includes:
   an oscillator including an electrode facing the object;
   a frequency detector outputting signals indicating a change in oscillation frequency of the oscillator; and
   a processor for processing the signals output from the frequency detector to derive the position of the object.

10. A transport apparatus for holding and transporting a conductive, planar object without contacting the object, comprising:
    at least three pairs of electrodes located above an upper surface of the object, each of the at least three pairs of electrodes having two electrodes opposite each other and carrying a potential difference therebetween to induce charges of opposite polarity and a current at the upper surface of the object that faces the pair of electrodes;

a magnetic field generator for generating magnetic fields in directions perpendicular to the directions of the currents induced in the object by the pairs of electrodes;

at least three horizontal displacement sensors for measuring the position of the object in a two-dimensional plane substantially parallel to the upper surface of the object; and a controller for controlling the potential difference applied to each of the at least three pairs of electrodes and intensities of the magnetic fields generated by the magnetic field generator in accordance with the position of the object measured by the horizontal displacement sensors.

11. The transport apparatus according to claim 10, wherein the at least three pairs of second electrodes include at least two pairs of electrodes, each inducing the current in the upper surface of the object in a first direction and at least one pair of electrodes inducing the current in the upper surface of the object in a second direction that is different from the first direction.

12. The transport apparatus according to claim 11, wherein the potential difference applied to each of the at least three pairs of electrodes includes a time-varying potential difference whose polarity is alternately reversed at a predetermined frequency.

13. The transport apparatus according to claim 10, wherein the potential difference applied to each of the at least three pairs of electrodes includes a time-varying potential difference whose polarity is alternately reversed at a predetermined frequency.

14. The transport apparatus according to claim 10, further comprising at least three vertical displacement sensors, each measuring the position of the object in a vertical direction substantially perpendicular to the upper surface of the object.

15. The transport apparatus according to claim 14, wherein each of at least three vertical displacement sensors includes an electric capacitance displacement sensor for measuring the position of the object in accordance with a change in electrostatic capacitance.

16. The transport apparatus according to claim 14, wherein each of the at least three vertical displacement sensor includes:
    an oscillator including an electrode facing the object;
    a frequency detector outputting signals indicating a change in oscillation frequency of the oscillator; and
    a processor for processing the signals output from the frequency detector to derive the position of the object.

17. The transport apparatus according to claim 10, wherein each of the at least three horizontal displacement sensors includes an electric capacitance displacement sensor for measuring the position of the object in accordance with a change in electrostatic capacitance.

18. A transport apparatus according to claim 10, wherein each of the at least three horizontal displacement sensor includes:
    an oscillator including an electrode facing the object;
    a frequency detector outputting signals indicating a change in oscillation frequency of the oscillator; and
    a processor for processing the signals output from the frequency detector to derive the position of the object.

19. A rotational motion generator for use in a non-contact transport apparatus for holding and transporting a planar, conductive object without contact, comprising:
    a support;
    a plurality of driving-use electrode pairs disposed on the support, each of the driving-use electrode pairs carrying a time-varying potential difference therebetween to induce an electric current in the object, at least two of the driving-use electrode pairs inducing the electric currents in different directions; and a plurality of magnetic field generators, each disposed adjacent a corresponding driving-use electrode pair, each of the magnetic field generators generating a time-varying magnetic field intersecting the current induced by the corresponding driving-use electrode pair, thus generating a Lorentz force in the object, the magnetic field being substantially perpendicular to the surface of the object such that the Lorentz force is generated in a direction substantially parallel to the surface of the object.

20. The rotational motion generator according to claim 19, further comprising:

an inductor having a fixed inductance connected to at least one of the driving-use electrode pairs;

a frequency detector for detecting an oscillation frequency of an oscillation circuit that includes the inductor and a capacitance of the at least one of the driving-use electrode pairs, the capacitance of the at least one of the driving-use electrode pairs depending on the position of the object; and a controller for processing signals indicating the detected oscillation frequency of the LC circuit to derive the position of the object.

21. The rotational motion generator according to claim 20, wherein the controller further determines the time-varying potential differences applied to the plurality of driving-use electrode pairs and the magnetic fields generated by the magnetic field generators to control the Lorentz forces in accordance with the derived position of the object.

22. The rotational motion generator according to claim 19, wherein each of the plurality of driving-use electrode pairs is disposed above the object and carries a constant bias potential to induce electric charges with a fixed polarity on the surface of the object to generate a force in the object in an upward direction substantially normal to the surface of the object by electrostatic induction, the generated forces being balanced with the weight of the object to float the object in the air.

23. The rotational motion generator according to claim 22, further comprising:

an inductor having a fixed inductance connected to at least one of the driving-use electrode pairs;

a frequency detector for detecting an oscillation frequency of an LC circuit that includes the inductor and a capacitance of the at least one of the driving-use electrode pairs, the capacitance of the at least one of the driving-use electrode pairs depending on the position of the object; and a controller for processing signals indicating the detected oscillation frequency of the LC circuit to derive the position of the object, wherein the controller further determines the constant bias potentials applied to the plurality of driving-use electrode pairs to control the upward forces applied to the object in accordance with the derived position of the object.

24. The rotational motion generator according to claim 19, further comprising a floating-use electrode pair disposed above the object and carrying a constant bias potential to induce electric charges with a fixed polarity on the surface of the object facing the floating-use electrode such that a force is generated in the object in an upward direction substantially normal to the surface of the object by electrostatic induction, the generated forces being balanced with the weight of the object to float the object in the air.

25. The rotational motion generator according to claim 24, further comprising:

an inductor having a fixed inductance connected to the floating-use electrode pair;

a frequency detector detecting an oscillation frequency of an LC circuit that includes the inductor and a capacitance of the floating-use electrode pair, the capacitance of the floating-use electrode pair depending on the position of the object; and a controller for processing signals indicating the detected oscillation frequency of the LC circuit to derive the position of the object.

26. The rotational motion generator according to claim 25, wherein the controller further determines the time-varying potential differences applied to the plurality of driving-use electrode pairs and the magnetic fields generated by the magnetic field generators to control the Lorentz forces in accordance with the derived position of the object.

27. The rotational motion generator according to claim 25, wherein the controller further determines the constant bias potential applied to the floating-use electrode pair to control the upward forces applied to the object in accordance with the derived position of the object.

28. A transport apparatus which holds and transports a conductive object without contacting the object, comprising:

a floating device that floats the object by using an electrostatic force;

a driving device that drives the object floated by the floating device in a driving direction substantially perpendicular to a floating direction of the object, the driving device disposed so that at least a part of the driving device faces to the object and driving the object by using a magnetic field;

a first detector that detects a position of the object in the driving direction; and a controller connected to the driving device and the first detector, the controller controlling the driving device in accordance with the detection result of the first detector.

29. The transport apparatus according to claim 28, further comprising an arm member supporting the floating device and the driving device.

30. The transport apparatus according to claim 29, wherein the arm member further supports the first detector.

31. The transport apparatus according to claim 28, wherein the floating device includes a first electrode part, and the driving device includes a second electrode part.

32. The transport apparatus according to claim 31, wherein the first electrode part and the second electrode part are constructed of the same electrode part.

33. The transport apparatus according to claim 28, wherein the driving device drives the object by a Lorentz force.

34. The transport apparatus according to claim 28, wherein the first detector is located adjacent the periphery of the object when the object is located at a predetermined position relative to the transport apparatus.

35. The transport apparatus according to claim 28, wherein the floating device includes a first electrode part, the driving device includes a second electrode part, and the first detector includes a third electrode part.

36. The transport apparatus according to claim 35, wherein at least one of the first and second electrode parts and the third electrode part are constructed of the same electrode part.

37. The transport apparatus according to claim 28, further comprising a second detector that detects a position of the object in the floating direction of the object.

38. The transport apparatus according to claim 28, wherein the transport apparatus is configured to be suitable for use in an exposure apparatus that exposes a pattern onto the object.

39. The transport apparatus according to claim 38, wherein the exposure apparatus is a step-and-scan type exposure apparatus.

40. A transport apparatus which holds and transports a conductive object without contacting the object, comprising:

a floating device that floats the object and includes a first electrode part;

a driving device that drives the object floated by the floating device in a driving direction substantially perpendicular to a floating direction of the object, the driving device being disposed such that at least a part of the driving device faces the object, the driving device including a second electrode part;

a first detector that detects a position of the object in the driving direction; and a controller connected to the driving device and the first detector, the controller controlling the driving device in accordance with detection results of the first detector.

41. The transport apparatus according to claim 40, wherein the first electrode part and the second electrode part are constructed of the same electrode part.

42. A transport apparatus which holds and transports a conductive object without contacting the object, comprising:

a floating device that floats the object and includes a first electrode part;

a driving device that drives the object floated by the floating device in a driving direction substantially perpendicular to a floating direction of the object, the driving device being disposed such that at least a part of the driving device faces the object, the driving device including a second electrode part;

a first detector that detects a position of the object in the driving direction and includes a third electrode part; and a controller connected to the driving device and the first detector, the controller controlling the driving device in accordance with detection results of the first detector.

43. The transport apparatus according to claim 42, wherein the third electrode part and at least one of the first and second electrode parts are constructed of the same electrode part.

44. A transport apparatus which holds and transports a conductive object without contacting the object, comprising:

a floating device that floats the object;

a driving device that drives the object floated by the floating device in a driving direction substantially perpendicular to a floating direction of the object;

a first detector that detects a position of the object in the driving direction, and a rotation angle of the object regarding an axis that is parallel to the floating direction;

a second detector that detects a position of the object in the floating direction of the object; and a controller connected to the floating device, the driving device, the first detector, and the second detector, the controller controlling the driving device in accordance with detection results of the first detector and controlling the floating device in accordance with detection results of the second detector.

45. A transport apparatus which holds and transports a conductive object without contacting the object, comprising:

a floating means for floating the object by using an electrostatic force;

a driving means for driving the object floated by the floating means in a driving direction substantially perpendicular to a floating direction of the object, the driving means driving the object by using a magnetic field; and a first detecting means for detecting a position of the object in the driving direction.

46. A method of transporting a conductive object without contacting the object, the method comprising the steps of:

floating the object by using an electrostatic force;

driving the object in a driving direction substantially perpendicular to a floating direction of the object by using a magnetic field while keeping the object floating;

detecting a position of the object in the driving direction; and controlling the driving accordance with the position of the object detected in the detecting step.

47. A method of forming a pattern on a conductive object utilizing an optical system, the method comprising the step of transporting the object to a predetermined place relative to the optical system by the method of claim 46.

* * * * *

UNITED STATES PATENT AND TRADEMARK OFFICE
CERTIFICATE OF CORRECTION

PATENT NO. : 6,160,338
DATED : December 12, 2000
INVENTOR(S) : Kazuya Ono

It is certified that error appears in the above-identified patent and that said Letters Patent is hereby corrected as shown below:

Column 26,
Line 42, after "controlling the driving" and insert -- direction in --.

Signed and Sealed this

Eighteenth Day of May, 2004

JON W. DUDAS
*Acting Director of the United States Patent and Trademark Office*